(12) United States Patent
Nakamura

(10) Patent No.: US 6,620,336 B2
(45) Date of Patent: Sep. 16, 2003

(54) POLISHING PAD, POLISHING APPARATUS AND POLISHING METHOD

(75) Inventor: Kenro Nakamura, Kamakura (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/816,169

(22) Filed: Mar. 26, 2001

(65) Prior Publication Data

US 2001/0024878 A1 Sep. 27, 2001

(30) Foreign Application Priority Data

Mar. 27, 2000  (JP) ........................ 2000-086382

(51) Int. Cl.$^7$ ............... B44C 1/22; H01L 21/301
(52) U.S. Cl. ............... 216/88; 216/89; 438/692; 438/693; 451/5; 451/66; 156/345.12
(58) Field of Search ............. 156/345.12; 216/86, 216/88, 89; 438/692, 693, 17; 451/66, 5

(56) References Cited

U.S. PATENT DOCUMENTS

| 4,793,895 A | * | 12/1988 | Kaanta et al. ............ 156/627 |
| 5,081,421 A | * | 1/1992 | Miller ...................... 324/671 |
| 5,337,015 A | * | 8/1994 | Lustig et al. ............. 324/671 |
| 5,637,031 A | * | 6/1997 | Chen ........................ 451/41 |
| 6,020,264 A | * | 2/2000 | Lustig ...................... 438/692 |

* cited by examiner

*Primary Examiner*—George Goudreau
(74) *Attorney, Agent, or Firm*—Finnegan, Henderson, Farabow, Garrett & Dunner, L.L.P.

(57) ABSTRACT

A polishing pad for use in polishing a surface of a substrate comprises a pad main body having a polishing surface and a plurality of electrode portions formed within the pad main body and mutually spaced apart in a plane direction of the pad main body. Each electrode portion is formed of a conductive portion and an insulating portion formed on the conductive portion.

13 Claims, 5 Drawing Sheets

POLISHING PAD, POLISHING APPARATUS AND POLISHING METHOD

CROSS-REFERENCE TO RELATED APPLICATIONS

This application is based upon and claims the benefit of priority from the prior Japanese Patent Application No. 2000-086382, filed Mar. 27, 2000, the entire contents of which are incorporated herein by reference.

BACKGROUND OF THE INVENTION

The present invention relates to a polishing pad, polishing apparatus and polishing method, more specifically, to a polishing pad, polishing apparatus and polishing method suitable for manufacturing a semiconductor device.

Recently, with the tendency of integration and miniaturization of semiconductor devices in the field of manufacturing semiconductor devices, various micro-processing techniques have been developed. Of them, chemical mechanical polishing (CMP) is an essential technique for forming a planarized interlayer insulating film, plug, buried metal wiring and buried isolation.

However, the CMP techniques have a problem. It is necessary to determine the end point of the CMP (at which point the CMP is stopped). Usually, the end point is detected by monitoring the friction force between the surface of a semiconductor wafer and a polishing pad during the polishing. The friction force is monitored by measuring the current of a motor rotating a polishing table or a polishing head. The end point is determined based on a change in measurement value of the current. However, in some cases, depending upon the polishing conditions or the structure of a surface to be polished (polish-receiving surface), the friction force does not change significantly. Particularly when the polishing is performed while a lightweight is applied, the friction force rarely changes.

There is another end-point detection method, in which the end point is optically monitored. In this method, the thickness of the surface film of a semiconductor wafer under polishing is optically measured, and the change of the film type is detected based on a reflection rate of the surface of the wafer. However, this method entails technical difficulties. Light must be applied by some means to the wafer surface under polishing.

To overcome the aforementioned problems, U.S. Pat. No. 4,793,895 proposes a method for monitoring current flowing on a polish-receiving surface, by a conductive electrode formed on a polishing pad. However, this method has problems. The conductive electrode exposed in the surface of the polishing pad is susceptible to corrosion with a polishing solution. In addition, the exposed surface of the conductive electrode may adversely affect the polishing characteristics of CMP. In short, the material for the electrode is limited by the use of the conductive electrode. It is actually difficult to select the material having no adverse effect upon the polishing characteristics.

As described above, how to detect the end-point is one of the problems associated with the CMP technique. However, conventional end-point detection methods do not always solve this problem.

BRIEF SUMMARY OF THE INVENTION

An object of the present invention is to provide a polishing pad, a polishing apparatus, and a polishing method capable of easily and accurately determining an end point of polishing such as CMP.

According to a first aspect of the present invention, there is provided a polishing pad for use in polishing a surface of a substrate; comprising: a pad main body having a polishing surface; and a plurality of electrode portions formed in the pad main body and mutually spaced apart in a plane direction of the pad main body, each of the electrode portions being formed of an conductive portion and an insulating portion formed on the conductive portion.

According to a second aspect of the present invention, there is provide a polishing apparatus for polishing a surface of a substrate by attaching the polishing pad thereto, comprising: a polishing table to which the polishing pad is to be attached; a holding portion for holding the substrate such that the surface of the substrate is in contact with the polishing surface and a surface of the insulating portion of the polishing pad attached to the polishing table; a driving portion for moving the polishing table and the holding portion relative to each other; a polishing liquid supply portion for supplying a polishing liquid onto a surface of the polishing pad attached to the polishing table; a voltage application portion for applying an alternating voltage between the electrode portions of the polishing pad attached to the polishing table, whereby a current flows along the surface of the substrate held by the holding portion; and a detecting portion for detecting the current via the electrode portions of the polishing pad attached to the polishing table.

According to a third aspect of the present invention, there is provide a polishing apparatus for polishing a surface of a substrate by attaching a polishing pad; comprising: a polishing table to which the polishing pad having a plurality of holes is to be attached, the polishing table including a polishing-table main body having a main surface and a plurality of electrode portions formed in the polishing-table main body and mutually spaced apart in a plane direction of the polishing-table main body, each of the electrode portions being formed of a conductive portion and an insulating portion formed on the conductive portion, each of the electrode portions having a protruding portion protruding from a plane including the main surface, the protruding portion being capable of fitting into the corresponding hole formed in the polishing pad; a holding portion for holding the substrate such that the surface of the substrate is in contact with a polishing surface of the polishing pad attached to the polishing table and a surface of the insulating portion of the polishing table; a driving portion for moving the polishing table and the holding portion relative to each other; a polishing liquid supply portion for supplying a polishing liquid onto a surface of the polishing pad attached to the polishing table; a voltage application portion for applying an alternating voltage between the electrode portions, whereby a current flows along the surface of the substrate held by the holding portion; and a detecting portion for detecting the current via the electrode portions.

According to a fourth aspect of the present invention, there is provide a polishing apparatus for polishing a surface of a substrate, comprising: a polishing table including a polishing-table main body having a polishing surface and a plurality of electrode portions formed in the polishing-table main body and mutually spaced apart in a plane direction of the polishing-table main body, each of the electrode portions being formed of a conductive portion and an insulating portion formed on the conductive portion, a holding portion for holding the substrate such that the surface of the substrate is in contact with the polishing surface and a surface of the insulating portion of the polishing table; a driving portion for moving the polishing table and the holding portion relative to each other; a polishing liquid supply portion for supplying a polishing liquid onto the polishing surface of the polishing table; a voltage application portion for applying an alternating voltage between the electrode portions, whereby a current flows along the surface of the substrate held by the holding portion; and a detecting portion for detecting the current via the electrode portions.

According to the present invention, it is possible to effectively detect the end point of polishing in a polishing process of a conductive film (any film such as semiconductor films e.g., polysilicon film, other than metal films may be used as long as it has a conductivity) on the surface of a substrate. More specifically, the end point of polishing can be easily and accurately determined by detecting the conductivity of the substrate surface by means of a plurality of electrode portions. As a result, the polishing is neither insufficient nor excessive and appropriately performed.

The conductive portion is protected by the insulating portion. Therefore, even if a polishing solution having a strong corrosion property is used, the conductive portion is not corroded. The current is detected by applying a high-frequency alternating voltage between the electrode portions and by functioning the insulating portion as a capacitor. Since the conductive portion is not directly exposed to the polishing solution and the high-frequency alternating voltage is applied, it is possible to prevent electrolysis of the polishing solution. Furthermore, the insulating portion may be formed of a material chosen from various insulating materials. Therefore, the insulating portion may be formed of the same or analogous material to that of the polishing pad. As a result, it is successfully prevent the electrode portion from adversely affecting the polishing properties.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, embodiments of the present invention will be explained with reference to the accompanying drawings.
(First embodiment)

Figure 1A:
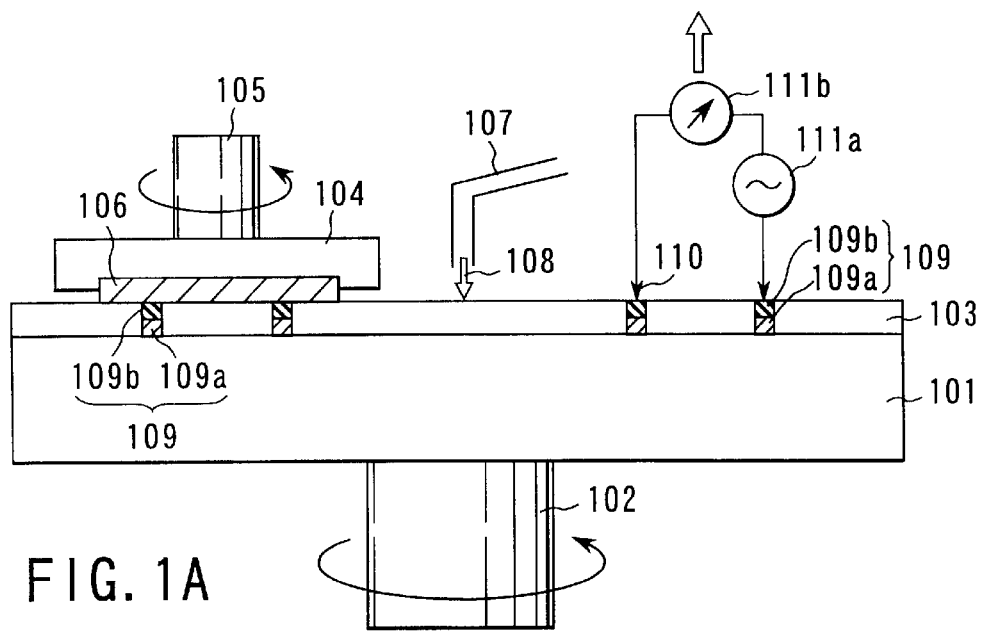
FIGS. 1A and 1B are schematic views of a structure of a polishing apparatus according to a first embodiment of the present invention.
Figure 1B:
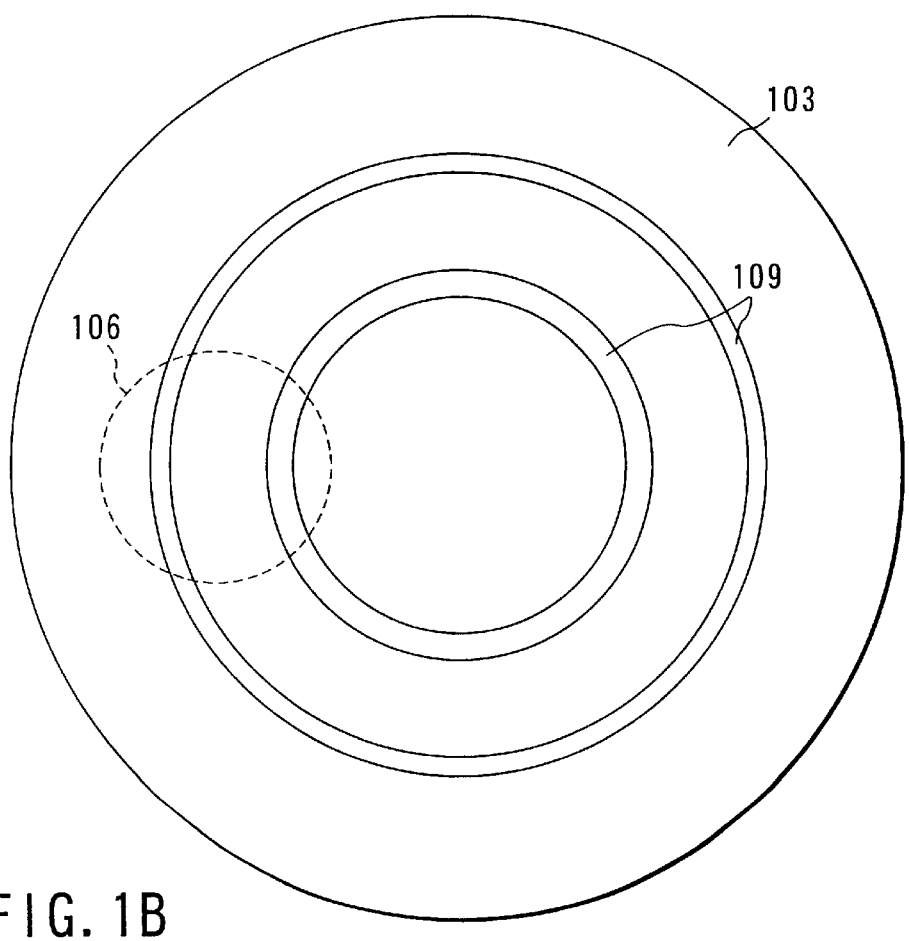

FIGS. 1A and 1B are schematic views of a structure of a polishing apparatus according to the present invention. FIG. 1A is a schematic side-view of the apparatus. FIG. 1B is a schematic top-view of the gist portion of the apparatus.

As shown in FIGS. 1A and 1B, a polishing table 101 rotates horizontally around a rotation shaft 102 in the direction of the arrow. A polishing pad 103 is attached to the surface of the polishing table 101.

A holding portion 104 for holding a semiconductor wafer 106 is arranged above and off the center of the polishing table 101. The holding portion 104 rotates around the rotation shaft 105, in the same direction as that of the polishing table 101. The holding portion 104 holds a semiconductor wafer 106 to be polished by a vacuum chuck. The semiconductor wafer 106 thus held is pressed at a predetermined pressure by a driving mechanism such as a cylinder, such that the polishing-receiving surface of the semiconductor wafer 106 comes into contact with the polishing surface of the polishing pad 103.

A slurry supply pipe 107 is disposed above the center portion of the polishing table 101. A slurry 108 is supplied on the polishing pad 103 from the slurry supply pipe 107.

Two electrode portions 109 are buried in the main body of the polishing pad 103 formed of an insulating material. The electrode portions are concentrically arranged at a distance from each other. Each of the two electrode portions 109 has a laminate structure formed of a conductive portion 109a and an insulating portion 109b (insulating film or insulating plate). The insulating portion 109b is stacked on the conductive portion 109a. The distance between two electrode portions 109 is set at such a value that the surface of the semiconductor wafer 106 comes into contact with two electrode portions 109 (insulating portion 109b).

Each of the two electrode portions 109 is designed to be in contact with a terminal 110. A high frequency voltage is applied to the electrode portions 109 via the terminals 110 by a voltage generating portion 111a. The current flowing between the two electrode portions 109 is detected by a current detector 111b. The CMP operation is controlled based on the detection results.

Figure 2A:
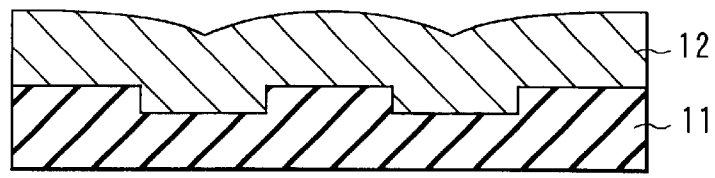
FIGS. 2A and 2B are schematic views for explaining a polishing process by the polishing apparatus according to the present invention.
Figure 2B:
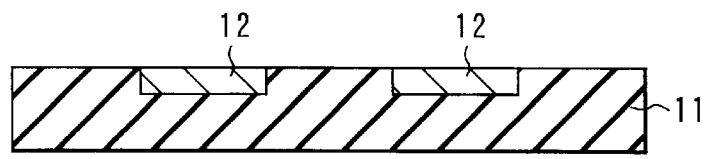

FIG. 2A is a cross-sectional view of the structure of the semiconductor wafer 106 to be subjected to CMP by the polishing apparatus shown in FIGS. 1A and 1B. A silicon oxide film 11 is formed on the main surface side of the semiconductor wafer. A metal film 12 is formed so as to fill wiring grooves formed in the silicon oxide film 11. In the first embodiment, damascene wiring is formed by CMP on the surface of the semiconductor wafer having the aforementioned structure, as shown in FIG. 2B.

The holding portion 104 (rotation speed: 50 rpm) holding the semiconductor wafer 106 is pressed against the polishing table 101 (rotation speed: 50 rpm) with the polishing pad 103 attached, at a pressure of 200 g/cm². Furthermore, the slurry 108 is supplied dropwise on the polishing pad 103 from the slurry supply pipe 107 at a rate of 200 ml/min. In the case where the metal film 12 is tungsten, ferric nitrate (about 8 wt %) dissolved in an alumina dispersion solution is used as the slurry 108. The slurry 108 is supplied between the semiconductor wafer 106 and the polishing pad 103 and then CMP is applied to the surface of the semiconductor wafer 106.

When the metal film 12 is formed over the entire surface of the semiconductor wafer 106, a large amount of current flows between the two conductive portions 109. However, as the thickness of the metal film 12 reduces, resistance increases. As a result, the current flowing between the two conductive portions 109 gradually decreases. On and after the metal film 12 is completely removed except within the grooves, the current value becomes constant at a low level. Therefore, the end point of the polishing process can be determined based on the change in current.

Figure 3:
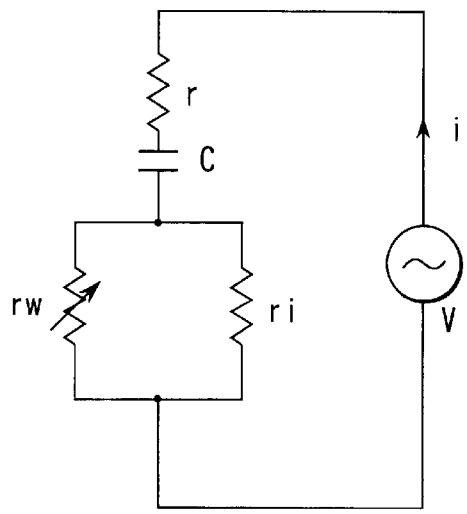
FIG. 3 is an arrangement of an equivalent circuit of a polishing apparatus according to the present invention, during a polishing process.

FIG. 3 shows an equivalent circuit of the system of the present invention. In this circuit, the resistance of the conductive portion 109a is represented by r, the capacitance of the insulating portion 109b is C, the surface resistance of the semiconductor wafer 106 between the electrode portions 109 is $r_w$, and the resistance associated with the ionic conductance of the slurry on the polishing pad 103 between the electrode portions 109 is $r_i$. The resistances $r_w$ and $r_i$ are arranged in parallel. The resistance r and the capacitance C are connected in series to the parallel arrangement portion.

The value of the resistance $r_w$ increases as the thickness of the metal film is reduced by CMP. The resistance value varies from 1 Ω up to infinite. The resistance r is about 10 Ω. The resistance $r_i$, although varies depending upon the type and concentration of the slurry, is usually about 100 Ω. If the frequency f of the high frequency voltage to be applied to the electrode portion 109 is increased, and the capacitance C of the insulating portion 109b is increased, the effect of the capacitance C can be ignored to some extent (r>>½πfC). To increase the capacitance C, it is necessary that the insulating portion 109b is formed of a material having a large dielectric constant, the film thickness of the insulating portion 109b is reduced and the area of the terminal 110 in contact with the insulating portion 109b is increased.

Figure 4:
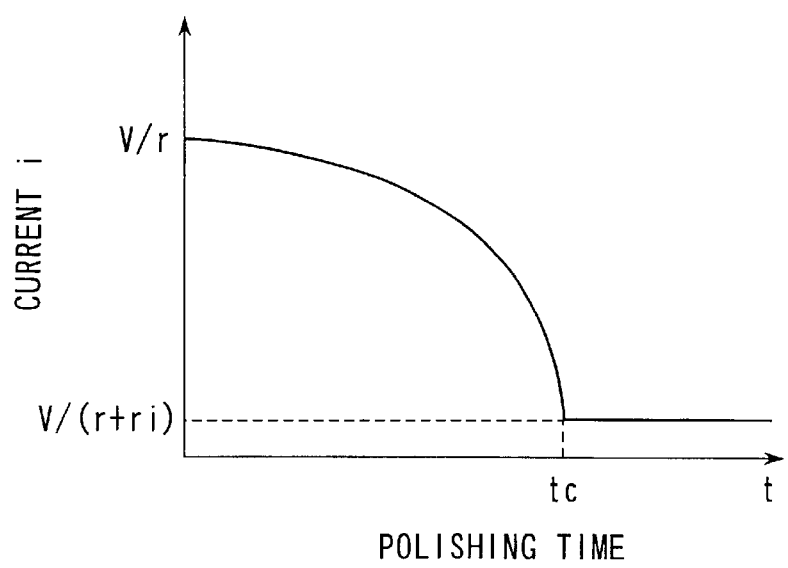
FIG. 4 is a graph showing a change of current with polishing time when polishing is performed by a polishing apparatus according to the present invention.

FIG. 4 shows a graph showing current (actual value) versus polishing time. The graph is drawn on the basis of the calculation which is made under the assumption that the thickness of the metal film reduces at a constant rate, in other words, the metal film is polished at a constant polishing rate.

The current reduces up to a point of tc, and thereafter it becomes constant. Therefore, the point of tc is the time point at which the metal film is just removed. This calculation is made under the assumption that the metal film is removed uniformly from the wafer at the time point tc. The thin film effect of the metal film (the increase of resistance due to electrons scattered at the interface) is ignored in the calculation. In practice, the current does not change exactly in the same manner as that of the calculation, in the vicinity of the time point $t_c$. Taking this point into consideration, the polishing is preferably finished at the time point which is about 10% longer than the end point of at which the polishing is considered to finish.

To avoid an adverse effect upon the semiconductor device, it is desirable that the voltage to be applied between the electrode portions 109 be as low as possible within the detectable range. The voltage on the order of mV or less is suitable. The high frequency voltage to be applied between the electrode portions 109 is preferably 1 kHz or more, more preferably, 10 kHz or more.

In the present invention, a high frequency voltage is applied via the insulating portion 109b. Therefore, the insulating portion 109b is formed thin by using a material having a high dielectric constant. Furthermore, to avoid an adverse effect upon the polishing characteristics, it is preferable that the material having identical or analogous elasticity and viscosity to those of the polishing pad 103 be used as the material for the insulating portion 109b. Moreover, to avoid formation of a step between the insulating portion 109b and the peripheral polishing pad 103, the insulating portion 109b and the polishing pad 103 are formed so as to be polished at an equal rate during the polishing process or dressing process. In addition, it is necessary to select a material which does not elude a contaminant to the wafer, after the CMP.

In the present invention, not the conductive portion 109a but the insulating portion 109b is exposed. Since the material of the insulating portion 109b can be selected from a wide variety of materials compared to the conductive portion 109a, it is possible that the insulating portion 109b is formed of the material having the aforementioned properties. The insulating portion 109b is preferably formed of the same material as that of the polishing surface of the polishing pad 103. For example, a polymer resin such as polyurethane is preferably used as a material of the insulating portion 109b and the polishing pad 103.

In the present invention, since the conductive portion 109a is covered with the insulating portion 109b, the conductive portion 109a can be successfully prevented from being corroded. Therefore, various materials also can be used in the conductive portion 109a.

(Second embodiment)

Figure 5A:
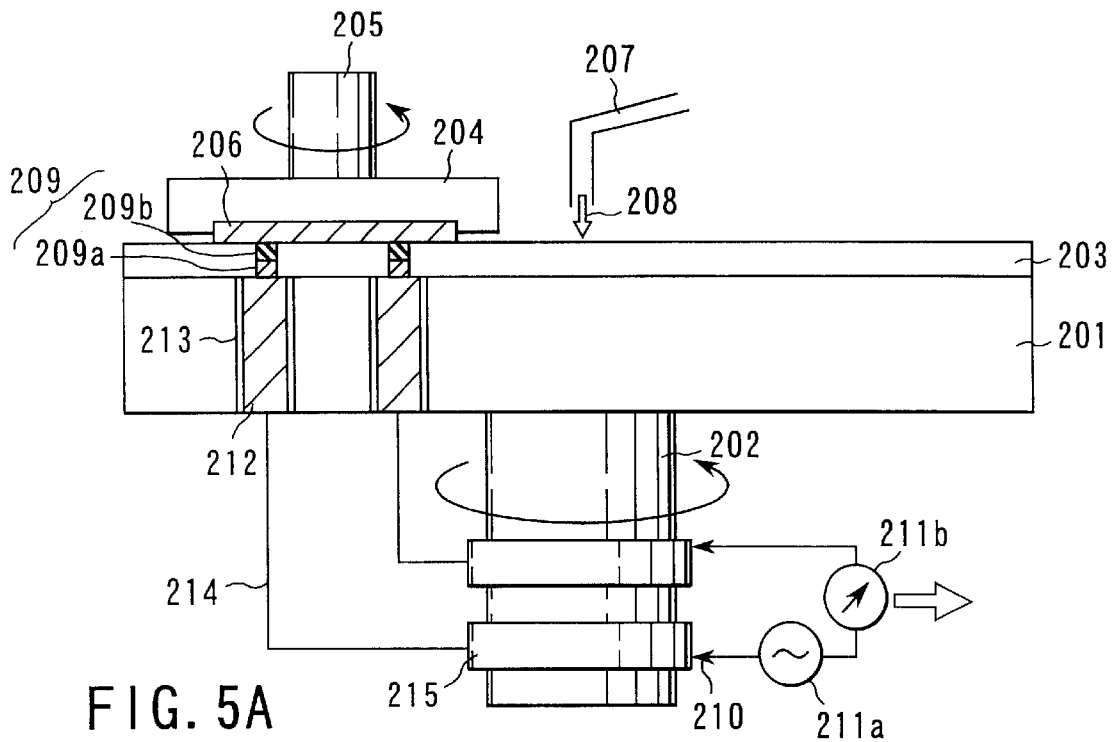
FIGS. 5A and 5B are schematic views showing a structure of a polishing apparatus according to a second embodiment of the present invention.
Figure 5B:
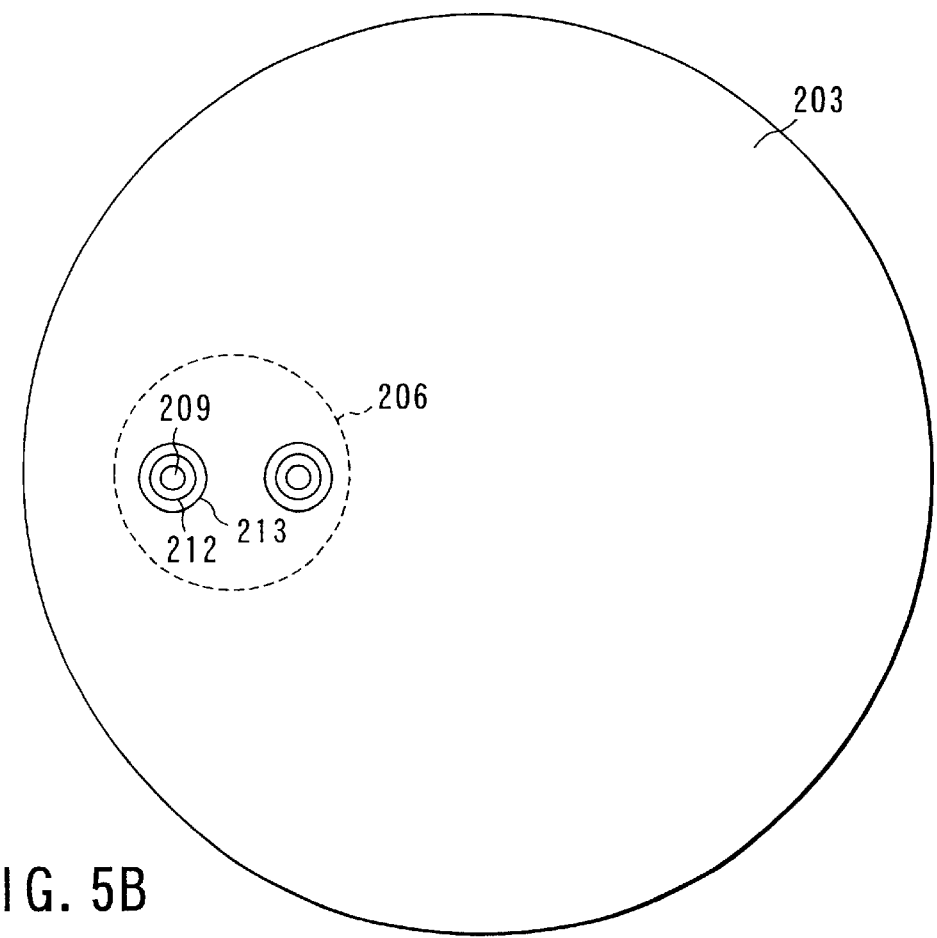

FIGS. 5A and 5B are schematic views showing a structure of a polishing apparatus according to a second embodiment of the present invention. FIG. 5A is a schematic side-view of the apparatus. FIG. 5B is a schematic top-view of the gist portion of the apparatus.

As shown in FIGS. 5A and 5B, a polishing table 201 is designed to rotate horizontally around a rotation shaft 202 in the direction of the arrow. A polishing pad 203 is attached to the surface of the polishing table 201.

A holding portion 204 for holding a semiconductor wafer 206 is arranged above and off the center of the polishing table 201. The holding portion 204 rotates around the rotation shaft 205 in the same direction as that of the polishing table 201. The holding portion 204 holds a semiconductor wafer 206 by a vacuum chuck. The semiconductor wafer 206 is pressed at a predetermined pressure by a driving mechanism e.g., a cylinder such that the polishing-receiving surface of the semiconductor wafer 206 thus held is in contact with the polishing surface of the polishing pad 203.

A slurry supply pipe 207 is disposed above the center portion of the polishing table 201. A slurry 208 is supplied onto the polishing pad 203 from the slurry supply pipe 207.

Two cylindrical electrode portions 209 are buried at a distance from each other in the main body of the polishing pad 203 formed of an insulating material. Each of the two electrode portions 209 has a laminate structure formed of a conductive portion 209a and an insulating portion 209b (insulating film or insulating plate), which is stacked on the conductive portion 209a. The distance between two conductive portions 209 is set in such a manner that the surface of the semiconductor wafer 206 is in contact with the two electrode portions 209 (insulating portion 209b) during polishing.

The two electrode portions 209 are electrically connected to two conducting poles 212, respectively. Each of the conducting poles 212 is connected to a conducting line 214 at the rear portion of the polishing table 201. The conducting line 214 is electrically connected to a rotation terminal 215 formed around the rotation shaft 202 of the polishing table.

A terminal 210 is further in contact with the rotation terminal 215. With this structure, a high frequency voltage is applied between two electrode portions 209 from a voltage generating portion 211a. The current flowing between the two electrode portions 209 is detected by a current detecting portion 211b. The CMP operation is controlled based on the detection results.

In the case where the polishing table 201 is made of a conductive material, an insulating tube 213 must be formed around the conducting pole 212. In the case where the rotation shaft 202 of the polishing table is made of a conductive material, an insulating material must be provided between the rotation terminal 215 and the rotation shaft 202.

The same voltage as that of the first embodiment is applied between the electrode portions 209. The electrode portions 209 are formed of the same material as in the first embodiment. The equivalent circuit used herein is the same as in the first embodiment.

The substrate shown in FIG. 2A is subjected to CMP under the same conditions and in the same manner as in the first embodiment. As a result, damascene wiring (shown in FIG. 2B) is obtained.

When the polishing table 201 is rotated, time zone A and time zone B are produced. In the time zone A, the semiconductor wafer 206 is in contact with the two electrode portions 209 (insulating portion 209b). In the time zone B, they are not in contact with each other. In the time zone A, both a surface conductivity of the semiconductor wafer 206 and the ion conductivity of the slurry interposed between the semiconductor wafer 206 and the polishing pad 203 contribute to the current, whereas, in the time zone B, only the ionic conductivity of the slurry placed on the polishing pad 203 contributes to the current.

When the metal film 12 is present over the entire surface of the wafer in the time zone A, a large amount of current flows between the two electrode portions 209. Since the resistance increases as the metal film 12 is reduced in thickness, the current flowing between the two electrode portions 209 gradually decreases. On and after the time the metal film 12 is completely removed except within a groove, the current value becomes constant at a low level. This is because only the ionic conductivity of the slurry contributes to the current. On the other hand, in the time zone B, the current value becomes constant at a low level no matter how thick the metal film 12 is. This is because only the ionic conductivity of the slurry contributes to the current.

As described above, there are two time zones A and B, so that the current (actual value) changes in a pulse fashion. Since the rotation number of the polishing table 201 is 50 rpm, the pulse has a period of 1.2 sec. The height of the pulse gradually reduces. Although the current changes in a pulse fashion, the current changes basically in the same manner as that of FIG. 4. Therefore, the end point of polishing can be determined in the same manner as in the first embodiment.

(Third embodiment)

Figure 6A:
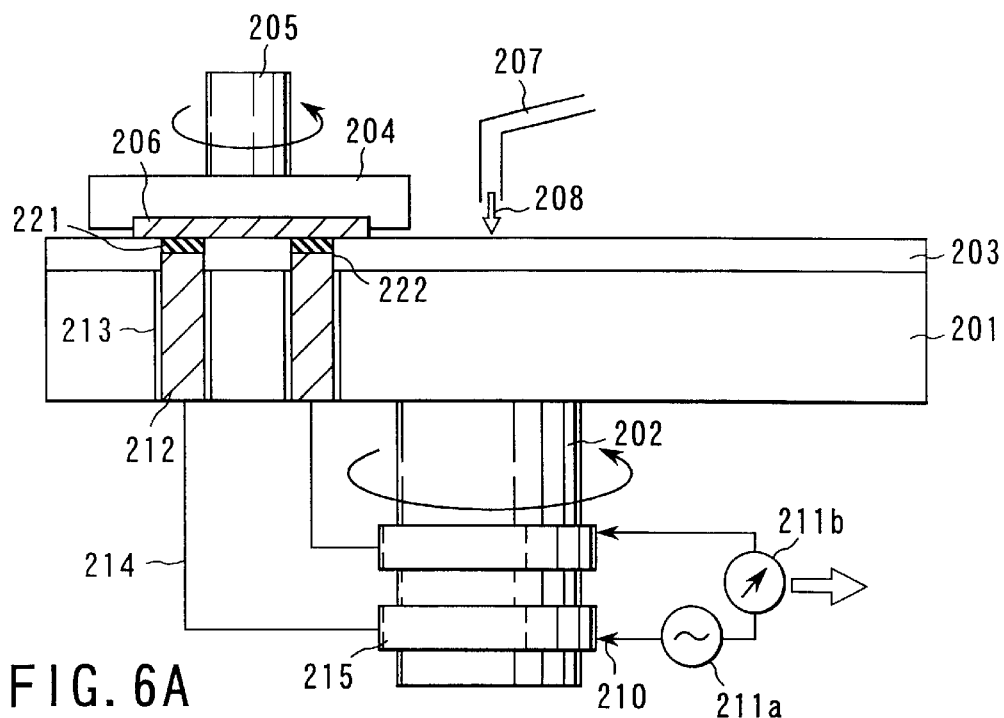
FIGS. 6A and 6B are schematic views showing a structure of a polishing apparatus according to a third embodiment of the present invention.
Figure 6B:
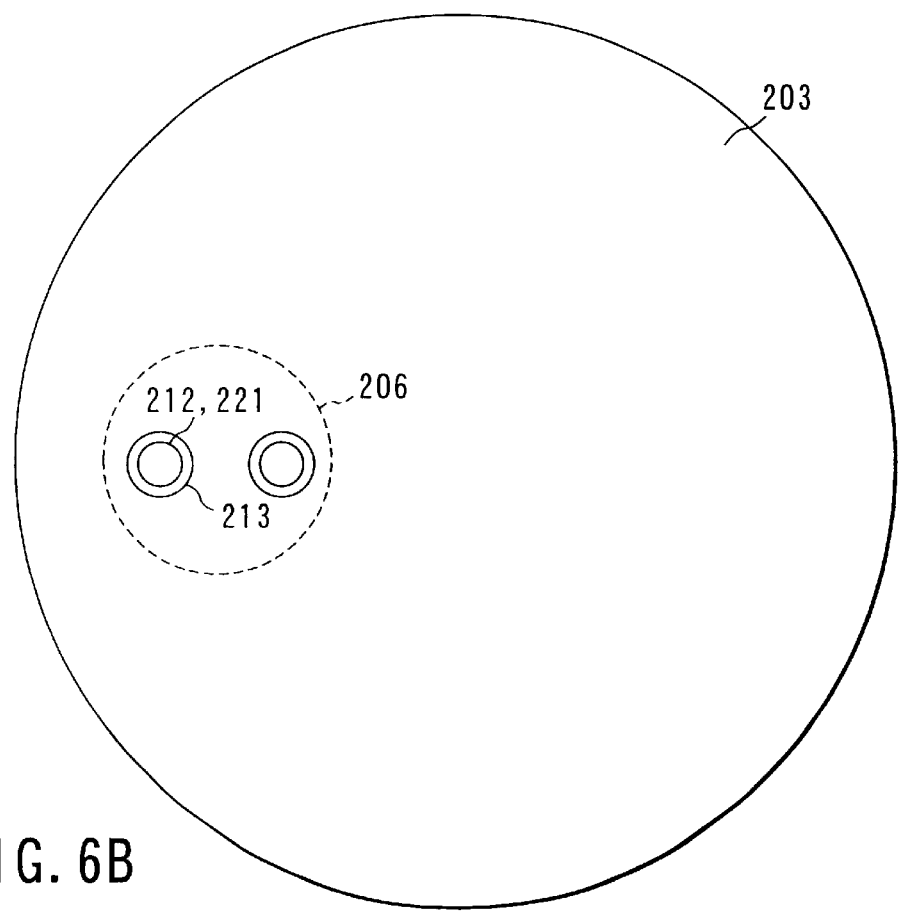

FIGS. 6A and 6B are schematic views of a structure of a polishing apparatus according to a third embodiment of the present invention. FIG. 6A is a schematic side-view of the apparatus. FIG. 6B is a schematic top-view of the gist portion of the apparatus. The basic structure is analogous to that of the second embodiment. The like reference numerals are used to designate like structural elements of FIGS. 6A and 6B corresponding to those like in FIGS. 5A and 5B.

In this embodiment, the top portion of each of the conducting poles 212 is allowed to protrude from the upper surface of the polishing table 201, as shown in FIGS. 6A and 6B. The protruding portion is designated by a reference numeral 222. The polishing pad 203 has holes corresponding to the protruding portions 222. The polishing pad 203 is attached to the polishing table 201 by inserting the protruding portions 222 through the holes. The upper surface of the conducting pole 212 is covered with an insulating portion 221 (insulating film or insulating plate). The insulating portion 221 may be provided in the polishing pad 203. The insulating portion 221 may be formed of the same material as employed in the previous embodiments. The upper surface of the protruding portion 222, in other words, the upper surface of the insulating portion 221, is on the same level with the upper surface of the polishing pad 203.

The equivalent circuit and the method of determining the end point of the polishing are the same as in previous embodiments.

According to this embodiment, the upper portions of the conducting poles 212 and the insulating portions 221 are allowed to protrude from the upper surface of the polishing table 201 to form the protruding portions 222. All things to do is to form holes for the protruding portions 222 in the polishing pad 203. Therefore, the polishing pad 203 can be formed at low cost. In this respect, this embodiment is advantageous.

(Fourth embodiment)

Figure 7A:
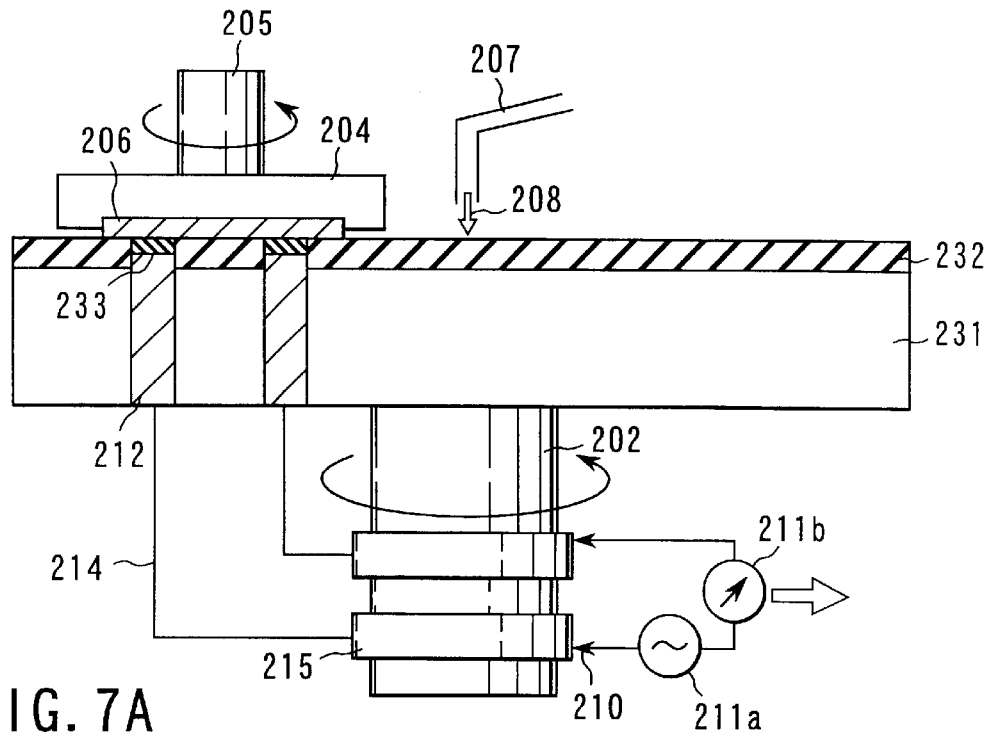
FIGS. 7A and 7B are schematic views showing a structure of a polishing apparatus according to a fourth embodiment of the present invention.
Figure 7B:
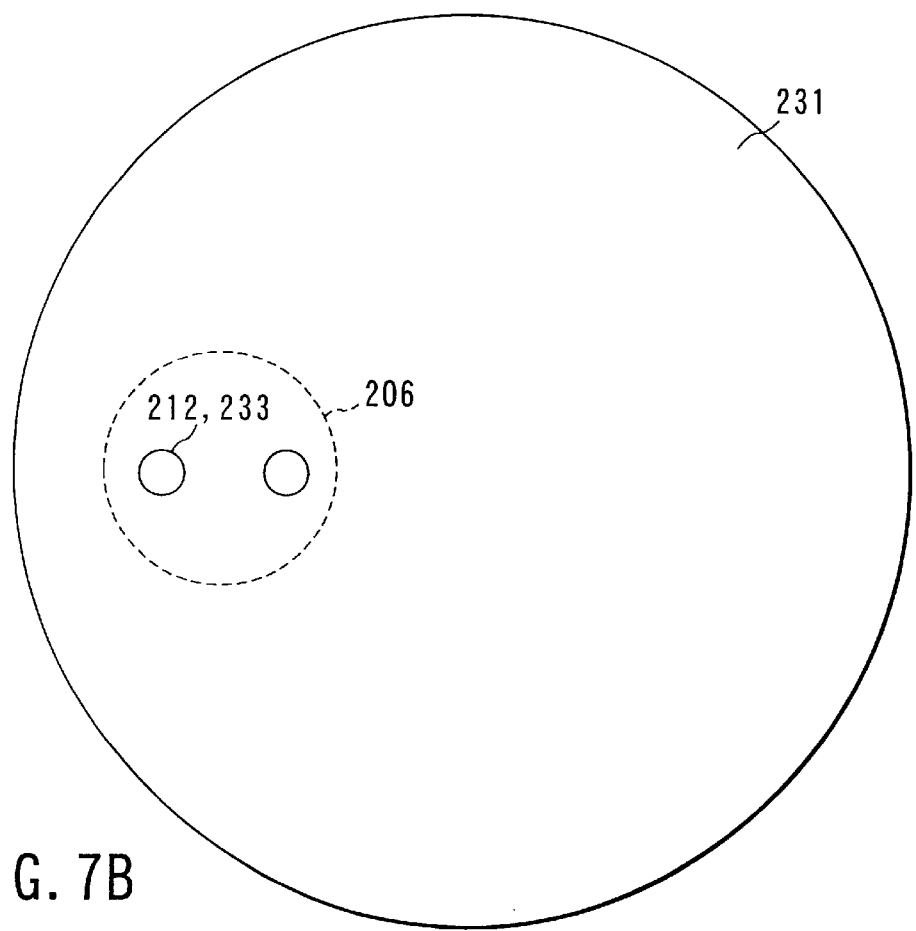

FIGS. 7A and 7B are schematic views of a structure of a polishing apparatus according to a fourth embodiment of the present invention. FIG. 7A is a schematic side-view of the apparatus. FIG. 7B is a schematic top-view of the gist portion of the apparatus. The basic structure of the apparatus is analogous to that of the second embodiment. The like reference numerals are used to designate like structural elements of FIGS. 7A and 7B corresponding to those like in FIGS. 5A and 5B.

In the aforementioned embodiments, the polishing pad is detachably provided to the polishing table. However, in this embodiment, a substrate is polished by a polishing surface integrated into the polishing table.

The surface region 232 of the polishing table 231 is used as a polishing surface, as shown in FIGS. 7A and 7B. The conducting pole 212 is formed in the polishing table in the same manner as in FIGS. 6A and 6B. The upper surface of the conductive pole 212 is covered with an insulating portion 233. The insulating portion 233 is formed of the same material as used in the previous embodiments. More specifically, the insulating portion 233 is formed of the same or analogous material as that of the surface region 232. The insulating portion 233 is formed at the same level as that of the surface region 232.

In this embodiment, the equivalent circuit and the method of determining the end point of the polishing are the same as those of the previous embodiments. The same effects can be obtained.

In the embodiments mentioned above, two electrode portions are formed. The number of the electrodes may be increased. A plurality of electrodes may be brought into contact with the surface of the semiconductor wafer. Where a plurality of electrode portions is used, the degrees of polishing at the center and peripheral portion of the wafer can be monitored. In other words, it is possible to monitor the in-plane uniformity of a semiconductor wafer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A polishing pad for use in polishing a surface of a substrate, comprising:
   a pad main body having a polishing surface; and
   a plurality of electrode portions formed in the pad main body and mutually spaced apart in a plane direction of the pad main body;
   each of the electrode portions being formed of a conductive portion and an insulating portion formed on the conductive portion and covering a polishing surface side of the conductive portion.

2. The polishing pad according to claim 1, wherein the insulating portion is formed of a polymer resin.

3. A polishing apparatus for polishing a surface of a substrate by attaching the polishing pad according to claim 1 thereto, comprising:
   a polishing table to which the polishing pad is to be attached;
   a holding portion configured to hold the substrate such that the surface of the substrate is in contact with the polishing surface and a surface of the insulating portion of the polishing pad attached to the polishing table;
   a driving portion configured to move the polishing table and the holding portion relative to each other;
   a polishing liquid supply portion configured to supply a polishing liquid onto a surface of the polishing pad attached to the polishing table;
   a voltage application portion configured to apply an alternating voltage between the electrode portions of the polishing pad attached to the polishing table, whereby a current flows along the surface of the substrate held by the holding portion; and
   a detecting portion configured to detect the current via the electrode portions of the polishing pad attached to the polishing table.

4. The polishing apparatus of claim 3, wherein the alternating voltage has a frequency of 1 KHz or more.

5. A polishing method for polishing a surface of a substrate, comprising:
   preparing a polishing table to which a polishing pad is attached, said polishing pad including a pad main body having a polishing surface and a plurality of electrode portions formed in the pad main body and mutually spaced apart in a plane direction of the pad main body, each of the electrode portions being formed of a conductive portion and an insulating portion formed on the conductive portion and covering a polishing surface side of the conductive portion;
   holding the substrate by a holding portion such that the surface of the substrate is in contact with the polishing surface and a surface of the insulating portion of the polishing pad attached to the polishing table;
   polishing the surface of the substrate held by the holding portion by means of the polishing pad attached to the polishing table by moving the polishing table and the holding portion relative to each other while supplying a polishing liquid onto a surface of the polishing pad; and
   applying an alternating voltage between the electrode portions, thereby detecting a current flowing along the surface of the substrate held by the holding portion via the electrode portions of the polishing pad attached to the polishing table.

6. A polishing apparatus for polishing a surface of a substrate by attaching a polishing pad, comprising:
   a polishing table to which the polishing pad having a polishing surface and a plurality of holes is to be attached, said polishing table including a polishing-table main body having a main surface and a plurality of electrode portions formed in the polishing-table main body and mutually spaced apart in a plane direction of the polishing-table main body, each of said electrode portions being formed of a conductive portion and an insulating portion formed on the conductive portion and covering a polishing surface side of the conductive portion, each of said electrode portions having a protruding portion protruding from a plane including the main surface, said protruding portion being capable of fitting into the corresponding hole formed in the polishing pad;
   a holding portion configured to hold the substrate such that the surface of the substrate is in contract with the polishing surface of the polishing pad attached to the polishing table and a surface of the insulating potion of the polishing table;
   a driving portion configured to move the polishing table and the holding portion relative to each other;
   a polishing liquid supply portion configured to supply a polishing liquid onto a surface of the polishing pad attached to the polishing table;
   a voltage application portion configured to apply an alternating voltage between the electrode portions, whereby a current flows along the surface of the substrate held by the holding portion; and
   a detecting portion configured to detect the current via the electrode portions.

7. The polishing apparatus according to claim 6, wherein said insulating portion is formed of a polymer resin.

8. The polishing apparatus according to claim 6, wherein the alternating voltage has a frequency of 1 kHz or more.

9. A polishing method for polishing a surface of a substrate, comprising:
   preparing a polishing table to which a polishing pad having a polishing surface and a plurality of holes is attached, said polishing table including a polishing-table main body having a main surface and a plurality of electrode portions formed in the polishing-table main body and mutually spaced apart in a plane direction of the polishing-table main body, each of said electrode portions being formed of a conducive portion and an insulating portion formed on the conductive portion and covering a polishing surface side of the conductive portion, each of said electrode portions having a protruding portion protruding from a plane including the main surface, said protruding portion being capable of fitting into the corresponding hole formed in the polishing pad;
   holding the substrate by a holding portion such that the surface of the substrate is in contact with the polishing surface of the polishing pad attached to the polishing table and a surface of the insulating potion of the polishing table;
   polishing the surface of the substrate held by the holding portion by means of the polishing pad attached to the polishing table by moving the polishing table and the holding portion relative to teach other while supplying a polishing liquid onto a surface of the polishing pad; and
   applying an alternating voltage between the electrode portions, thereby detecting a current flowing along the surface of the substrate held by the holding portion via the electrode portions.

10. A polishing apparatus for polishing a surface of a substrate, comprising;

a polishing table including a polishing-table main body having a polishing surface and a plurality of electrode portions formed in the polishing-table main body and mutually spaced apart in a plane direction of the polishing-table main body, each of said electrode portions being formed of a conductive portion and an insulating portion formed on the conductive portion and completely covering a polishing surface side of the conductive portion;

a holding portion configured to hold the substrate such that the surface of the substrate is in contact with the polishing surface and a surface of the insulating portion of the polishing table;

a driving portion configured to move the polishing table and the holding portion relative to each other;

a polishing liquid supply portion configured to supply a polishing liquid onto the polishing surface of the polishing table;

a voltage application portion configured to apply an alternating voltage between the electrode portions, whereby a current flows along the surface of the substrate held by the holding portion; and a detecting portion configured to detect the current via the electrode portions.

11. The polishing apparatus according to claim 10, wherein said insulating portion is formed of a polymer resin.

12. The polishing apparatus according to claim 10, wherein the alternating voltage has a frequency of 1 kHz or more.

13. A polishing method for polishing a surface of a substrate, comprising:

preparing a polishing table including a polishing-table main body having a polishing surface and a plurality of electrode portions formed in the polishing-table main body and mutually spaced apart in a plane direction of the polishing-table main body, each of said electrode portions being formed of a conductive portion and an insulating portion formed on the conductive portion and covering a polishing surface side of the conductive portion;

holding the substrate by a holding portion such that the surface of the substrate is in contact with the polishing surface and a surface of the insulating portion of the polishing table;

polishing the surface of the substrate held by the holding portion by means of the polishing surface of the polishing table by moving the polishing table and the holding portion relative to each other while supplying a polishing liquid onto the polishing surface of the polishing table; and applying an alternating voltage between the electrode portions, thereby detecting a current flowing along the surface of the substrate held by the holding portion via the electrode portions.

\* \* \* \* \*

UNITED STATES PATENT AND TRADEMARK OFFICE
CERTIFICATE OF CORRECTION

PATENT NO.    : 6,620,336 B2
DATED         : September 16, 2003
INVENTOR(S)   : Nakamura It is certified that error appears in the above-identified patent and that said Letters Patent is hereby corrected as shown below:

<u>Column 10,</u>
Line 16, change "in contract with" to -- in contact with --.
Line 45, change "conducive portion" to -- conductive portion --.
Line 56, change "insulating potion" to -- insulating portion --.
Line 61, change "to teach other" to -- to each other --.

Signed and Sealed this

Eighteenth Day of November, 2003

JAMES E. ROGAN
*Director of the United States Patent and Trademark Office*